(12) United States Patent
Rapoport et al.

(10) Patent No.: US 10,401,452 B2
(45) Date of Patent: Sep. 3, 2019

(54) SYSTEM FOR REDUCTION OF A MAGNETIC FRINGE FIELD OF A MAGNETIC RESONANCE IMAGING DEVICE

(71) Applicant: Aspect Imaging Ltd., Shoham (IL)

(72) Inventors: Uri Rapoport, Moshav Ben Shemen (IL); Yoram Cohen, Yarkona (IL); Yair Goldfarb, Ness Ziona (IL)

(73) Assignee: ASPECT IMAGING LTD., Shoham (IL)

( * ) Notice: Subject to any disclaimer, the term of this patent is extended or adjusted under 35 U.S.C. 154(b) by 64 days.

(21) Appl. No.: 15/581,297

(22) Filed: Apr. 28, 2017

(65) Prior Publication Data

US 2018/0313921 A1   Nov. 1, 2018

(51) Int. Cl.
| | | |
|---|---|---|
| *G01V 3/00* | (2006.01) | |
| *G01R 33/421* | (2006.01) | |
| *G01R 33/28* | (2006.01) | |
| *G01R 33/383* | (2006.01) | |

(52) U.S. Cl.
CPC .......... *G01R 33/421* (2013.01); *G01R 33/288* (2013.01); *G01R 33/383* (2013.01)

(58) Field of Classification Search
USPC ....................................................... 324/322
See application file for complete search history.

(56) References Cited

U.S. PATENT DOCUMENTS

| | | |
|---|---|---|
| 3,242,523 A | 3/1966 | Daley |
| 3,504,932 A | 4/1970 | Kozowyk et al. |
| 3,534,251 A | 10/1970 | Richards |

(Continued)

FOREIGN PATENT DOCUMENTS

| | | |
|---|---|---|
| DE | 202013105276 | 2/2014 |
| EP | 0825450 | 8/1997 |

(Continued)

OTHER PUBLICATIONS

Maramraju, Sri Harsha, et al. Electromagnetic interactions in a shielded PET/MRI system for simultaneous PET/MRI imaging in 9.4 T: evaluation and results, IEEE Transactions on Nuclear Science 59, 5 (2012): pp. 1892-1896.

(Continued)

*Primary Examiner* — Rodney E Fuller
(74) *Attorney, Agent, or Firm* — Pearl Cohen Zedek Latzer Baratz LLP

(57) ABSTRACT

A magnetic resonance imaging (MRI) system is provided. The MRI system can include a magnetic field device to generate a magnetic field within a measurement volume and to generate a magnetic fringe field external to the measurement volume. The MRI system can include a ferromagnetic housing to envelop the magnetic field device. The housing can have a first portion and a second portion, where thickness of the first portion is different from thickness of the second portion. The MRI system can include a plate having a plate opening and positioned external to the housing at a predetermined distance from the housing. In some embodiments, the magnetic fringe field generated by the MRI system can be asymmetric with respect to a center of the measurement volume.

18 Claims, 6 Drawing Sheets

(56) References Cited

U.S. PATENT DOCUMENTS

| | | | |
|---|---|---|---|
| 4,490,675 A * | 12/1984 | Knuettel | A61B 5/0555 324/318 |
| 4,587,504 A * | 5/1986 | Brown | G01R 33/3815 324/319 |
| 4,590,428 A * | 5/1986 | Muller | G01R 33/381 324/315 |
| 4,646,046 A * | 2/1987 | Vavrek | G12B 17/02 174/384 |
| 4,910,461 A | 3/1990 | Van Vaals | |
| 4,912,445 A * | 3/1990 | Yamasaki | G01R 33/381 335/301 |
| 4,977,585 A | 12/1990 | Boyd | |
| 5,012,217 A * | 4/1991 | Palkovich | G01R 33/3875 324/318 |
| 5,028,872 A | 7/1991 | Nakabayashi | |
| 5,038,129 A * | 8/1991 | Oue | G01R 33/421 324/318 |
| 5,039,826 A | 8/1991 | Newland | |
| 5,065,760 A | 11/1991 | Krause et al. | |
| 5,159,929 A | 11/1992 | Morris et al. | |
| 5,243,286 A | 9/1993 | Rzedzian et al. | |
| 5,304,932 A | 4/1994 | Carlson | |
| 5,305,749 A | 4/1994 | Li et al. | |
| 5,323,776 A | 6/1994 | Blakeley et al. | |
| 5,572,131 A | 11/1996 | Rzedzian | |
| 5,594,200 A | 1/1997 | Ramsey | |
| 5,635,889 A | 6/1997 | Stelter | |
| 5,659,281 A | 8/1997 | Pissanetzky et al. | |
| 5,986,531 A * | 11/1999 | Carrozzi | G01R 33/422 324/318 |
| RE36,679 E | 5/2000 | Zakhor et al. | |
| RE36,782 E * | 7/2000 | Brown | G01R 33/3815 335/216 |
| 6,188,015 B1 | 2/2001 | Curran, Sr. et al. | |
| 6,215,309 B1 | 4/2001 | Rzedzian et al. | |
| 6,346,814 B1 | 2/2002 | Carrozzi et al. | |
| 6,546,814 B1 | 4/2003 | Choe et al. | |
| 6,711,430 B1 | 3/2004 | Ferris et al. | |
| 6,801,038 B2 | 10/2004 | Carrozzi et al. | |
| 6,873,156 B2 | 3/2005 | Ferris et al. | |
| 6,995,562 B2 | 2/2006 | Laskaris et al. | |
| 7,071,692 B2 | 7/2006 | Branch et al. | |
| 7,141,974 B2 | 11/2006 | Edelstein et al. | |
| 7,157,911 B2 | 1/2007 | Suzuki et al. | |
| 7,171,256 B1 | 1/2007 | Graessle et al. | |
| 7,375,526 B2 | 5/2008 | Edelstein et al. | |
| 7,529,575 B2 | 5/2009 | Rezzonico et al. | |
| 7,633,294 B2 | 12/2009 | Leussler et al. | |
| 7,715,895 B1 | 5/2010 | Graessle et al. | |
| 7,772,503 B2 | 8/2010 | Ginanneschi | |
| 7,801,613 B2 | 9/2010 | Li et al. | |
| 8,384,387 B1 | 2/2013 | Damadian et al. | |
| 8,807,084 B2 | 8/2014 | Rapoport et al. | |
| 8,851,018 B2 | 10/2014 | Rapoport et al. | |
| 8,896,310 B2 | 11/2014 | Rapoport | |
| 9,301,724 B2 | 4/2016 | McKnight et al. | |
| 9,470,769 B2 * | 10/2016 | Bilu | G01R 33/422 |
| 9,498,167 B2 | 11/2016 | Mostafavi et al. | |
| 9,562,956 B2 | 2/2017 | Rapoport | |
| 9,597,246 B2 | 3/2017 | Rapoport | |
| 9,655,291 B2 * | 5/2017 | Ozaki | H05K 9/0075 |
| 2002/0057088 A1 | 5/2002 | Carrozzi et al. | |
| 2003/0016518 A1* | 1/2003 | Arz | G01R 33/422 361/818 |
| 2003/0058502 A1 | 3/2003 | Griffiths et al. | |
| 2003/0088175 A1 | 5/2003 | Branch et al. | |
| 2005/0046422 A1 | 3/2005 | Edelstein et al. | |
| 2005/0049491 A1 | 3/2005 | Rezzonico et al. | |
| 2006/0103383 A1 | 5/2006 | Tanabe | |
| 2006/0186884 A1* | 8/2006 | Mallett | G01R 33/28 324/318 |
| 2007/0026733 A1 | 2/2007 | Greim et al. | |
| 2007/0135704 A1 | 6/2007 | Branch et al. | |
| 2007/0232894 A1 | 10/2007 | Feenan | |
| 2007/0276614 A1 | 11/2007 | Tan et al. | |
| 2008/0060843 A1* | 3/2008 | Ginanneschi | G01R 33/422 174/378 |
| 2008/0094062 A1 | 4/2008 | Edelstein et al. | |
| 2008/0186026 A1 | 8/2008 | Leussler et al. | |
| 2009/0072939 A1 | 3/2009 | Shen et al. | |
| 2009/0135578 A1* | 5/2009 | Mallett | G01R 33/288 361/816 |
| 2009/0209846 A1 | 8/2009 | Bammer | |
| 2010/0000780 A1 | 1/2010 | Zhu et al. | |
| 2011/0162652 A1 | 7/2011 | Rapoport | |
| 2012/0046722 A1 | 2/2012 | Olsen et al. | |
| 2012/0071745 A1 | 3/2012 | Rapoport | |
| 2012/0118630 A1 | 5/2012 | Jiang et al. | |
| 2012/0119742 A1 | 5/2012 | Rapoport | |
| 2013/0229181 A1 | 9/2013 | Biber et al. | |
| 2013/0328560 A1 | 12/2013 | Rapoport | |
| 2014/0051976 A1 | 2/2014 | Rapoport et al. | |
| 2014/0117989 A1* | 5/2014 | Rapoport | G01R 33/288 324/322 |
| 2014/0139216 A1 | 5/2014 | Rapoport | |
| 2014/0266203 A1* | 9/2014 | Rapoport | G01R 33/30 324/318 |
| 2014/0354279 A1 | 12/2014 | Dumoulin et al. | |
| 2014/0364722 A1 | 12/2014 | Dumoulin | |
| 2014/0378821 A1 | 12/2014 | Rapoport et al. | |
| 2015/0059655 A1 | 3/2015 | Rapoport | |
| 2015/0112186 A1 | 4/2015 | Rapoport et al. | |
| 2015/0137812 A1 | 5/2015 | Rapoport | |
| 2015/0141799 A1 | 5/2015 | Rapoport et al. | |
| 2015/0168519 A1 | 6/2015 | Rapoport | |
| 2015/0208994 A1 | 7/2015 | Rapoport | |
| 2015/0212172 A1 | 7/2015 | Rapoport | |
| 2015/0212173 A1 | 7/2015 | Rapoport | |
| 2015/0253400 A1 | 9/2015 | Rapoport | |
| 2015/0253401 A1 | 9/2015 | Rapoport | |
| 2017/0146619 A1 | 5/2017 | Strauss et al. | |
| 2017/0176557 A1 | 6/2017 | Azulay et al. | |
| 2017/0256853 A1 | 9/2017 | Anderson et al. | |

FOREIGN PATENT DOCUMENTS

| | | |
|---|---|---|
| GB | 2436875 | 10/2007 |
| JP | 62207448 | 9/1987 |
| JP | H013013139 | 12/1989 |
| JP | 2005270422 | 10/2005 |
| WO | WO89/04049 | 5/1989 |
| WO | WO93/21645 | 10/1993 |
| WO | WO2000001611 | 3/2000 |
| WO | WO02/03090 | 1/2002 |
| WO | WO2015071906 | 5/2015 |

OTHER PUBLICATIONS

Hart, Segmented and Shielded Structures for Reduction of Thermal Expansion-Induced Tilt Errors, Precision Engineering Research Group Massachusetts Institute of Technology, Oct. 2004, pp. 443-458.

* cited by examiner

SYSTEM FOR REDUCTION OF A MAGNETIC FRINGE FIELD OF A MAGNETIC RESONANCE IMAGING DEVICE

FIELD OF THE INVENTION

Generally, the present invention relates to the field of magnetic resonance imaging systems. More particularly, the present invention relates to shielding of a magnetic fringe field.

BACKGROUND OF THE INVENTION

Typically, magnetic resonance imaging (MRI) systems can generate a magnetic fringe field external to a measurement volume of the MRI system. The magnetic fringe field can, for example, interfere with electronic equipment in the fringe field and/or attract metallic objects positioned in a vicinity of the MRI system. The metallic objects attracted by the magnetic fringe field can, for example, enter into the measurement volume of the MRI system, thereby endangering a patient undergoing a MRI scan. Accordingly, MRI devices are typically deployed in a dedicated MRI room.

Deployment of MRI systems in a dedicated room can be expensive and can require dedicated space within a hospital, doctor's office and/or other institution using MRI systems. Therefore, it can be desirable to deploy MRI systems without requiring a dedicated MRI room.

SUMMARY OF THE INVENTION

There is thus provided, in accordance with some embodiments of the invention, a magnetic resonance imaging (MRI) system, the system includes: a magnetic field device to generate a magnetic field within a measurement volume and to generate a magnetic fringe field external to the measurement volume, wherein the measurement volume is to accommodate at least a portion of a patient; a ferromagnetic housing to envelop the magnetic field device, the housing having a first portion and a second portion, wherein thickness of the first portion is different from thickness of the second portion; and a plate, having a plate opening, positioned external to the housing at a predetermined distance from the housing, wherein the plate opening is aligned with a corresponding housing opening in the housing to allow insertion of at least a portion of the patient therethrough; wherein the generated magnetic fringe field is asymmetric.

In some embodiments, at least one of the thickness of the second portion of the housing, the distance between the plate and the housing and dimensions of the plate are predetermined to reduce the magnetic fringe field at the plate opening to a predetermined value.

In some embodiments, the second portion of the housing comprises the housing opening.

In some embodiments, the thickness of the second portion of the housing is greater compared to the thickness of the second portion of the housing.

In some embodiments, the plate comprises a metal alloy, the metal alloy comprises at least one of: copper, iron, aluminum, ferromagnetic material, paramagnetic material or any combination thereof.

In some embodiments, the plate is coupled to the housing using a non-ferromagnetic and a non-paramagnetic material.

In some embodiments, the system is positioned within a desired room and wherein the plate is coupled to at least one of: a floor of the room, a ceiling of the room or any combination thereof.

In some embodiments, a shape of the plate is selected from the group consisting of: a square, a rectangular, and an oval.

In some embodiments, the plate has a thickness of 12 millimeters.

In some embodiments, dimensions of the plate and the distance of the plate from the housing are predetermined based on a desired magnetic fringe field at the plate opening.

There is thus provided, in accordance with some embodiments of the invention, a ferromagnetic housing to envelop a magnetic field device, the housing includes: a first portion and a second portion, wherein thickness of the first portion is different from thickness of the second portion; and a housing opening to allow insertion of at least a portion of the patient therethrough into a measurement volume of the magnetic field device.

In some embodiments, the thickness of the second portion of the housing is predetermined to reduce a magnetic fringe field in a region adjacent to the second portion.

In some embodiments, the second portion of the housing comprises the housing opening.

In some embodiments, the thickness of the second portion of the housing is greater compared to the thickness of the second portion of the housing.

It will be appreciated that, for simplicity and clarity of illustration, elements shown in the figures have not necessarily been drawn to scale. For example, the dimensions of some of the elements may be exaggerated relative to other elements for clarity. Further, where considered appropriate, reference numerals may be repeated among the figures to indicate corresponding or analogous elements.

BRIEF DESCRIPTION OF THE DRAWINGS

The subject matter regarded as the invention is particularly pointed out and distinctly claimed in the concluding portion of the specification. The invention, however, both as to organization and method of operation, together with objects, features, and advantages thereof, can be understood by reference to the following detailed description when read with the accompanying drawings in which:

Figure 1A:
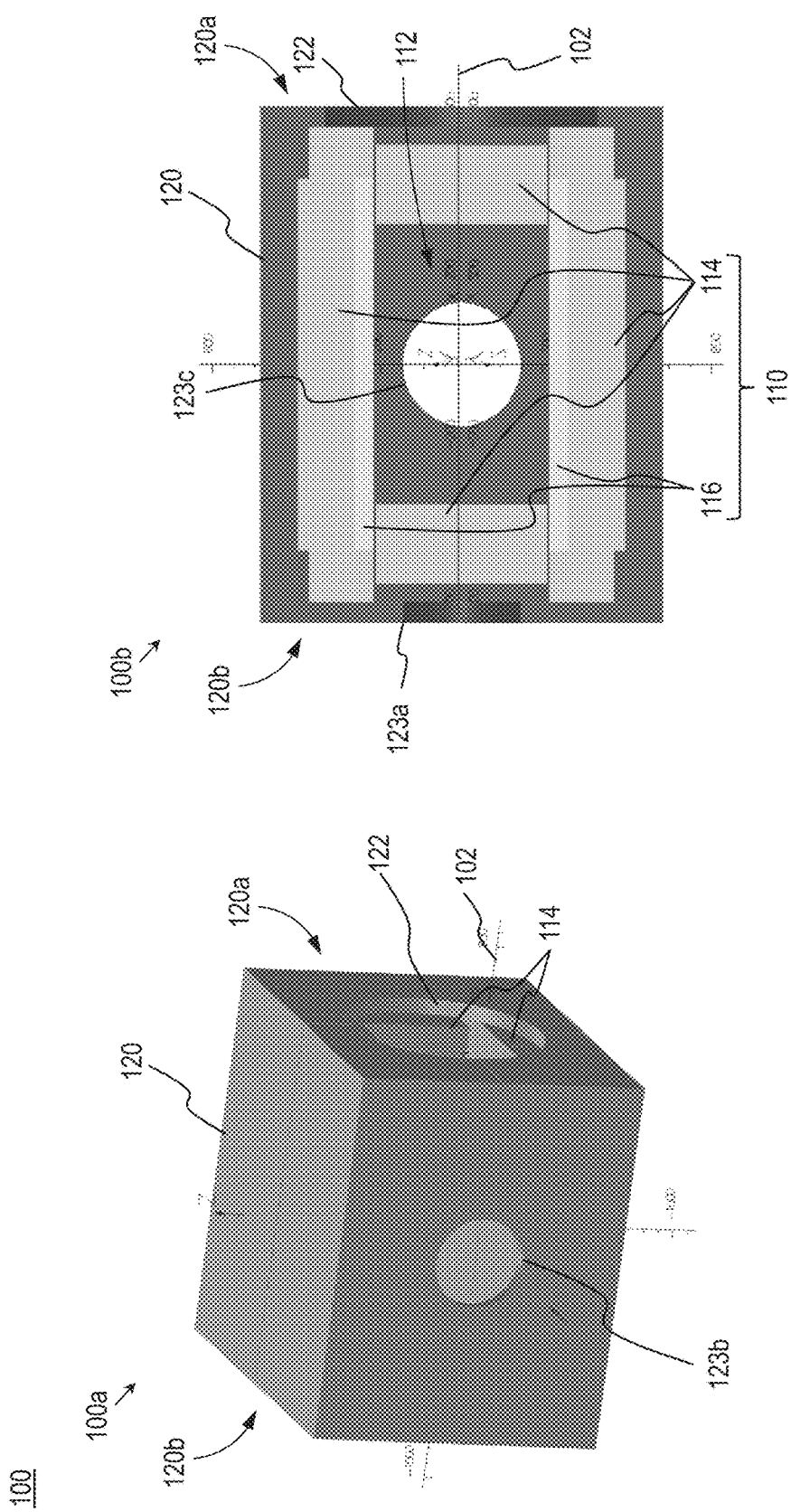
FIGS. 1A-1B schematically illustrate a magnetic resonance imaging (MRI) system according to some embodiments of the invention.

It will be appreciated that, for simplicity and clarity of illustration, elements shown in the figures have not necessarily been drawn to scale. For example, the dimensions of some of the elements may be exaggerated relative to other elements for clarity. Further, where considered appropriate, reference numerals may be repeated among the figures to indicate corresponding or analogous elements.

DETAILED DESCRIPTION OF THE INVENTION

In the following description, various aspects of the present invention are described. For purposes of explanation, specific configurations and details are set forth in order to provide a thorough understanding of the present invention. However, it will also be apparent to one skilled in the art that the present invention may be practiced without the specific details presented herein. Furthermore, well known features may have been omitted or simplified in order not to obscure the present invention. With specific reference to the drawings, it is stressed that the particulars shown are by way of example and for purposes of illustrative discussion of the present invention only, and are presented in the cause of providing what is believed to be the most useful and readily understood description of the principles and conceptual aspects of the invention. In this regard, no attempt is made to show structural details of the invention in more detail than is necessary for a fundamental understanding of the invention, the description taken with the drawings making apparent to those skilled in the art how the several forms of the invention may be embodied in practice.

Before at least one embodiment of the invention is explained in detail, it is to be understood that the invention is not limited in its application to the details of construction and the arrangement of the components set forth in the following description or illustrated in the drawings. The invention is applicable to other embodiments that may be practiced or carried out in various ways as well as to combinations of the disclosed embodiments. Also, it is to be understood that the phraseology and terminology employed herein is for the purpose of description and should not be regarded as limiting.

Figure 1B:
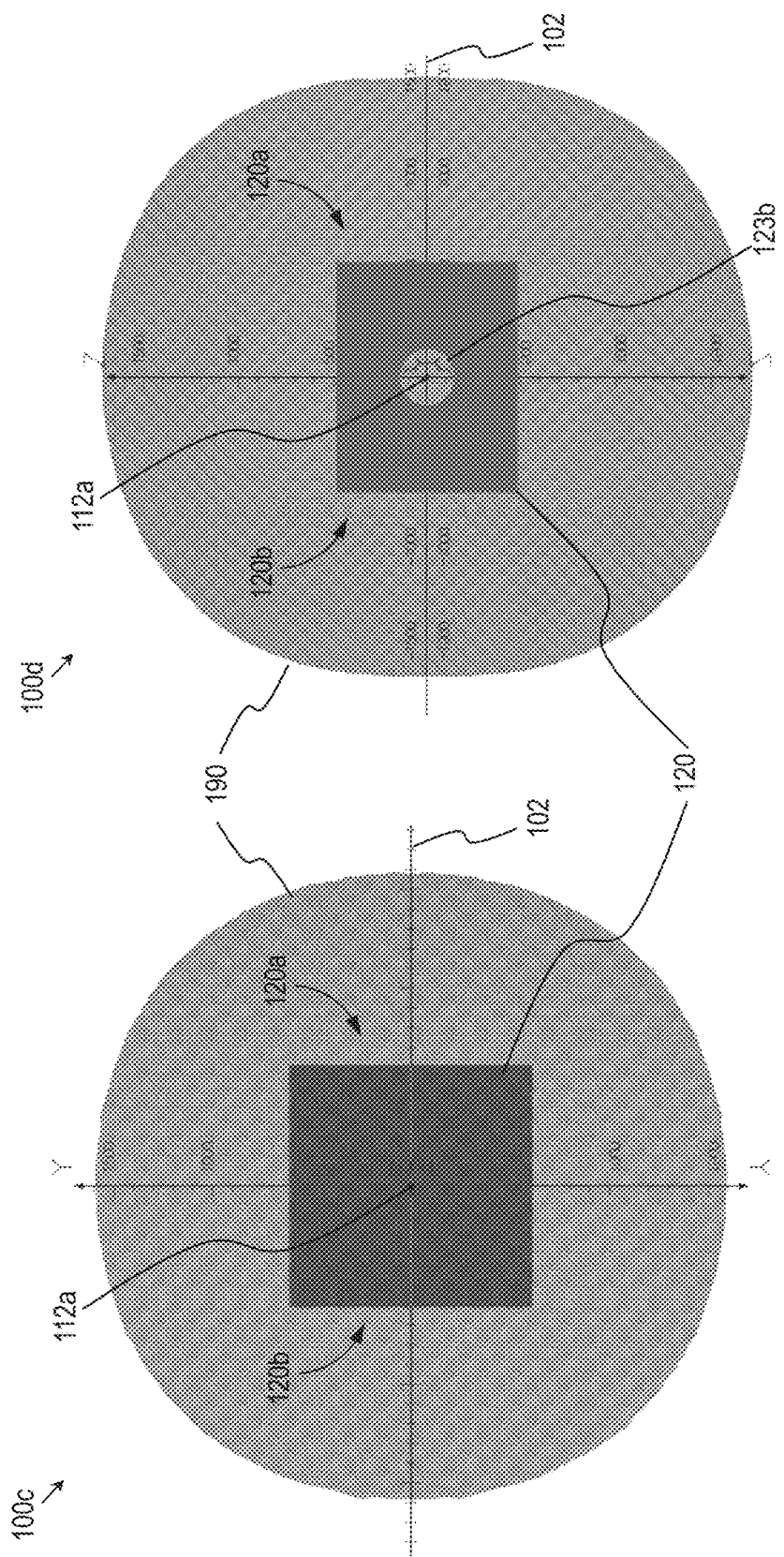

Reference is now made to FIGS. 1A-1B, which schematically illustrate a magnetic resonance imaging (MRI) system 100 according to some embodiments of the invention.

Illustrations 100a and 100b in FIG. 1A show a perspective view and a side cross-sectional view of the MRI system, respectively. Illustrations 100c and 100d in FIG. 1B show a top view and a side view of the MRI system 100, respectively, and a region 190 surrounding the MRI system 100, in which the magnetic fringe field is greater than a predetermined value (e.g., a magnetic field value based on the magnetic field strength that can cause metallic objects to move towards the MRI system 100).

The MRI system 100 can include a magnetic field device 110. The magnetic field device 110 can generate a magnetic field within a measurement volume 112 and can generate a magnetic fringe field external to the measurement volume 112. The magnetic field device can include multiple magnets 114 (e.g., permanent magnets). The magnetic field device can include multiple ferromagnetic elements 116 (e.g., pole pieces) that can be positioned adjacent to at least one of the multiple magnets 114 (e.g., as shown in FIG. 1A). In some embodiments, the measurement volume 112 is adapted to accommodate at least a portion (e.g., a head) of a patient (not shown).

The MRI system 100 can include a housing 120 that can be made of a ferromagnetic material. The housing 120 can include a proximal end 120a and a distal end 120b along a longitudinal axis 102 of the MRI system 100. The housing 120 can envelope the magnetic field device 110. The housing 120 can include a housing opening 122 at the proximal end 120a. The housing opening 122 can enable insertion of the at least portion of the patient (e.g., the head) within the measurement volume 112 of the magnetic field device 110.

In some embodiments, the housing 120 includes additional openings, for example, a first additional opening 123a, a second additional opening 123b and/or a third additional opening 123c. The first additional opening 123a can be positioned at the distal end 120b of the housing 120 and/or can be coaxially aligned with the housing opening 122 (e.g., as shown in FIG. 1A). The second additional opening 123b and/or the third additional opening 123c can be positioned at various locations of the housing 120, for example as shown in FIG. 1A. The additional openings 123a-c can, for example, reduce a weight of the housing 120.

In some embodiments, the housing opening 122 has greater diameter as compared to additional openings 123a-c. In some embodiments, the housing 120 includes the housing opening 122 without additional openings 123a-c.

The MRI system 100 can generate magnetic field within the measurement volume 112 of the magnetic field device 110. The magnetic field measured at a center 112a of the measurement volume 112 can range, for example, between 4900-5100 Gauss. The MRI system 100 can generate magnetic fringe field in a region 190 surrounding the MRI system 100. The region 190 can indicate a region in which the magnetic fringe field is above a predetermined value, for example 10 Gauss. The magnetic fringe field generated by the MRI system 100 can be substantially symmetric with respect to the center 112a of the measurement volume 112 (e.g., as shown in FIG. 1B). The magnetic fringe field measured on the longitudinal axis 102 at a predetermined distance of 1000 mm from the center 112a of the measurement volume 112 can range, for example, between 35-45 Gauss Reference is now made to FIGS. 2A-2B, which schematically illustrate a magnetic resonance imaging (MRI) system 200, including an asymmetric housing 220, according to some embodiments of the invention.

Figure 2A:
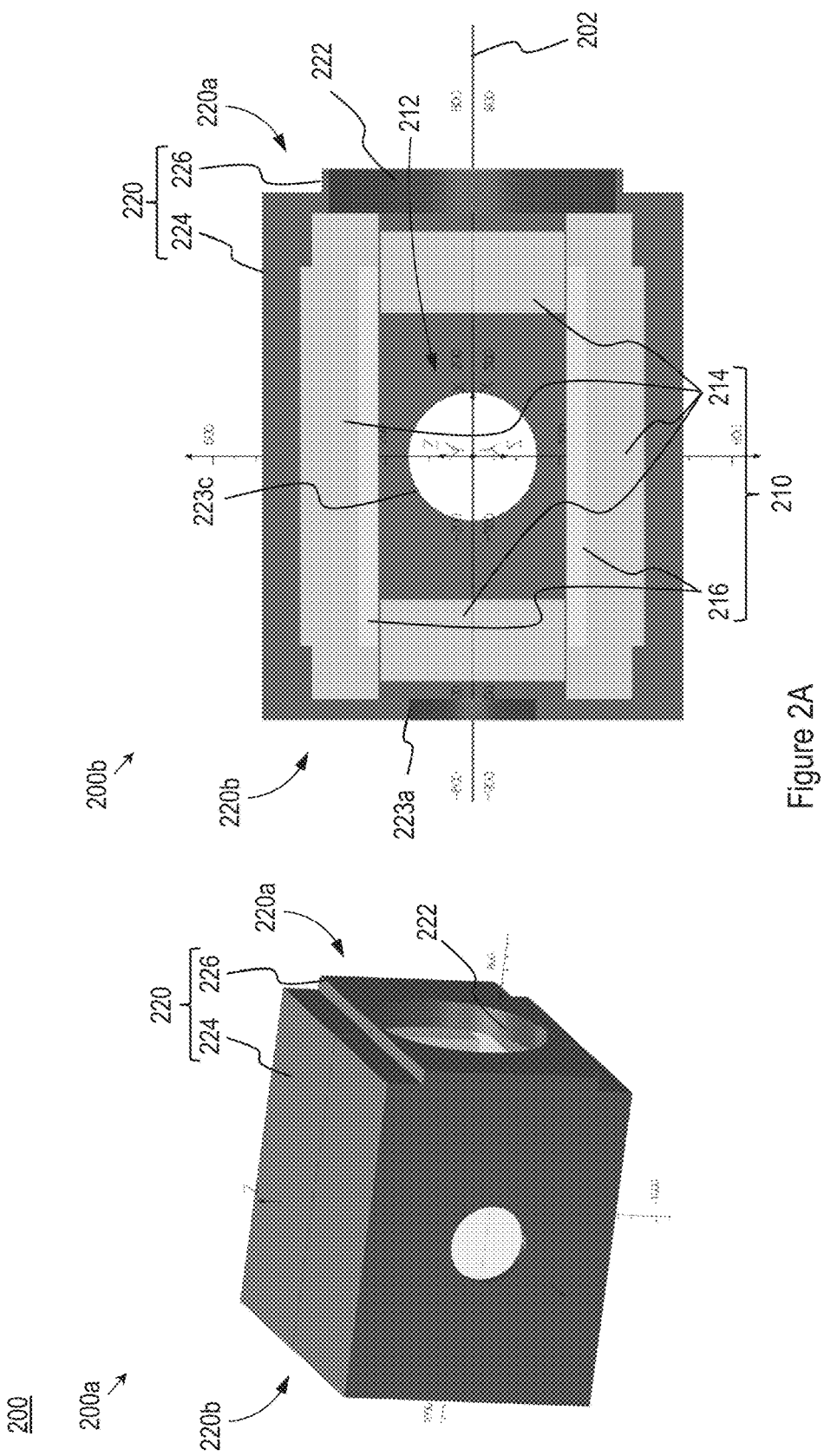
FIGS. 2A-2B schematically illustrate a magnetic resonance imaging (MRI) system, including an asymmetric housing, according to some embodiments of the invention.
Figure 2B:
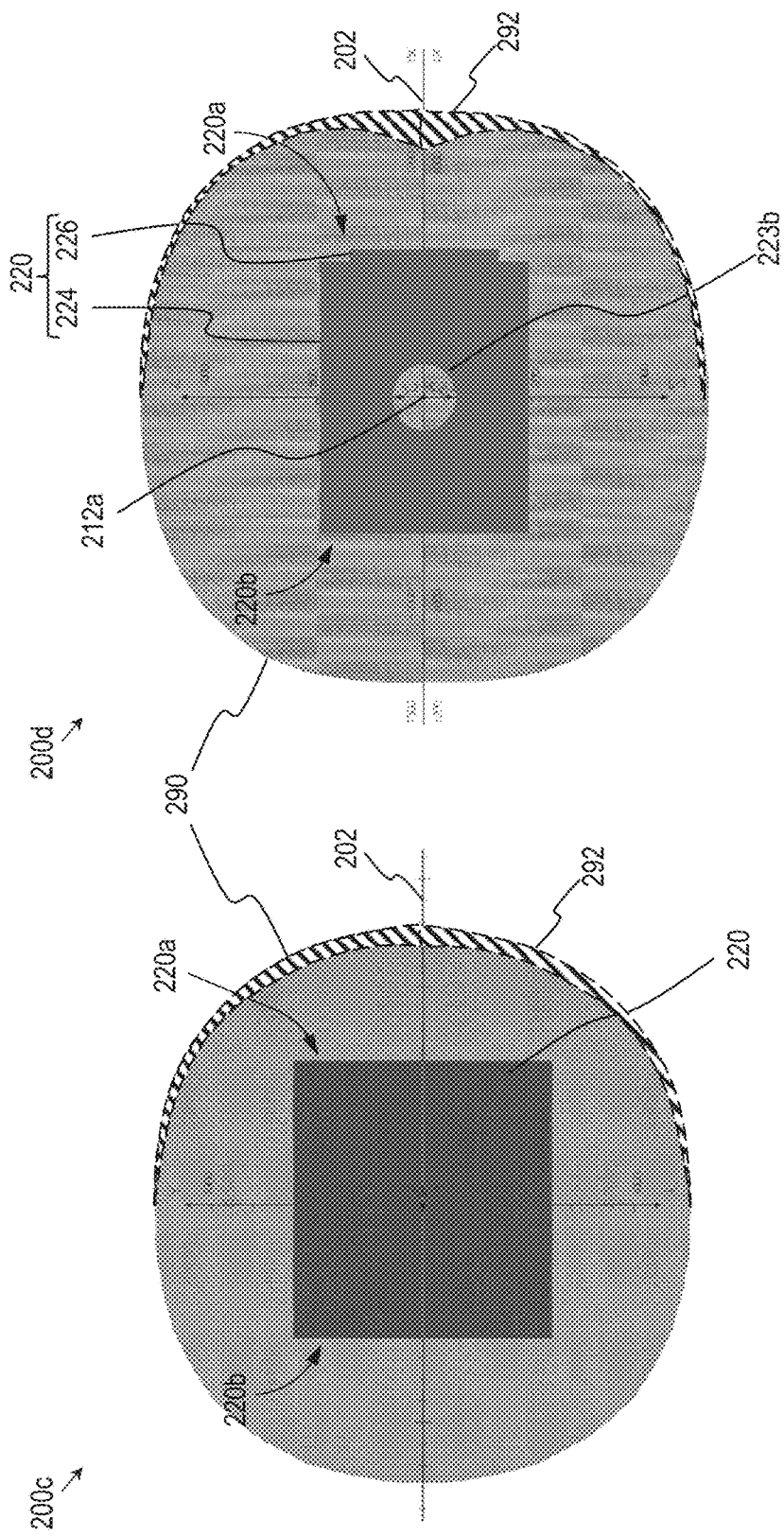

Illustrations 200a and 200b in FIG. 2A show a perspective view and a side cross-sectional view of the MRI system, respectively. Illustrations 200c and 200d in FIG. 2B show a top view and a side view of the MRI system 200, respectively, and a region 290 surrounding the MRI system 200, in which the magnetic fringe field is greater than a predetermined value.

The MRI system 200 can include a magnetic field device 210. The magnetic field device 210 can generate a magnetic field within a measurement volume 212 and can generate a magnetic fringe field external to the measurement volume 212. In various embodiments, the magnetic field device 210 and/or the measurement volume 212 are identical to the magnetic field device 110 and the measurement volume 112, respectively, as described above with respect to FIGS. 1A-1B.

The magnetic field device 210 can include multiple magnets 214 (e.g., permanent magnets) and/or multiple ferromagnetic elements 216 (e.g., pole pieces) that can be positioned adjacent to at least one of the multiple magnets 214 (e.g., as shown in FIG. 2A). In various embodiments, magnets 214 and/or ferromagnetic elements 216 are identical to magnets 114 and ferromagnetic elements 116, respectively, as described above with respect to FIGS. 1A-1B.

The MRI system 200 can include a housing 220 that can be made of a ferromagnetic material. The housing 220 can include a proximal end 220a and a distal end 220b along a longitudinal axis 202 of the MRI system 200. The housing 220 can envelope the magnetic field device 210. The housing 220 can include a housing opening 222 at the proximal end 220a. The housing opening 222 can enable insertion of at least a portion of a patient (e.g., a head) within the measurement volume 212 of the magnetic field device 210. In some embodiments, the housing opening 222 is identical to the housing opening 122, as described above with respect to FIGS. 1A-1B. In various embodiments, the housing 220 includes additional openings (e.g., a first additional opening 223a, a second additional opening 223b and/or a third additional opening 223c) that can be identical to the additional openings 123 (e.g., the first additional opening 123a, the second additional opening 123b and/or the third additional opening 123c), as described above with respect to FIGS. 1A-1B. In some embodiments, the housing 220 includes the housing opening 222 without additional openings 223a-c.

The housing 220 can include a first portion 224 and/or a second portion 226, where a thickness of the first portion 224 can be different from a thickness of the second portion 226 (e.g., as shown in FIG. 2A). In some embodiments, the second portion 226 includes at least a portion of the proximal end 220a of the housing 220 (e.g., around the housing opening 222). In various embodiments, the thickness of the first portion 224 and/or the thickness of the second portion 226 are predetermined to reduce the magnetic fringe field external to the housing 220. In some embodiments, the thickness of the second portion 226 is greater than the thickness of the first portion 224 (e.g., as shown in FIG. 2A). For example, the thickness of the first portion 224 can range between 45-55 mm and/or the thickness of the second portion 226 can range between 90-110 mm.

In various embodiments, the second portion 226 includes at least a portion of the proximal end 220a (e.g., around the housing opening 222) and/or at least a portion of at least one of: distal end 220b and/or side portions of housing 220 (e.g., around at least some of the additional openings 223a-c). In various embodiments, housing 220 includes two (e.g., the first portion 224 and the second portion 226) or more portions (not shown), where each of the portions has different thickness.

The MRI system 200 can generate magnetic field within the measurement volume 212 of the magnetic field device 210. The magnetic field measured at a center 212a of the measurement volume 212 can range, for example, between 4900-5100 Gauss. The MRI system 200 can generate magnetic fringe field in a region 290 surrounding the MRI system 200. The region 290 can indicate a region in which the magnetic fringe field is above a predetermined value, for example 10 Gauss. The magnetic fringe field generated by the MRI system 200 can be asymmetric with respect to the center 212a of the measurement volume 212. For example, the region 290 can include a zone 292 (e.g., indicated by a dashed pattern in FIG. 2B) positioned adjacent to the second portion 226 at the proximal end 220a of the housing 220, in which the magnetic fringe field can be smaller as compared to the magnetic fringe field in corresponding opposite zone of the region 290 poisoned adjacent to the distal end 220b of the housing 220. The magnetic fringe field measured on the longitudinal axis 202 at a predetermined distance of 1000 mm from the center 212a of the measurement volume 212 can range, for example, between 15-25 Gauss.

Figure 3A:
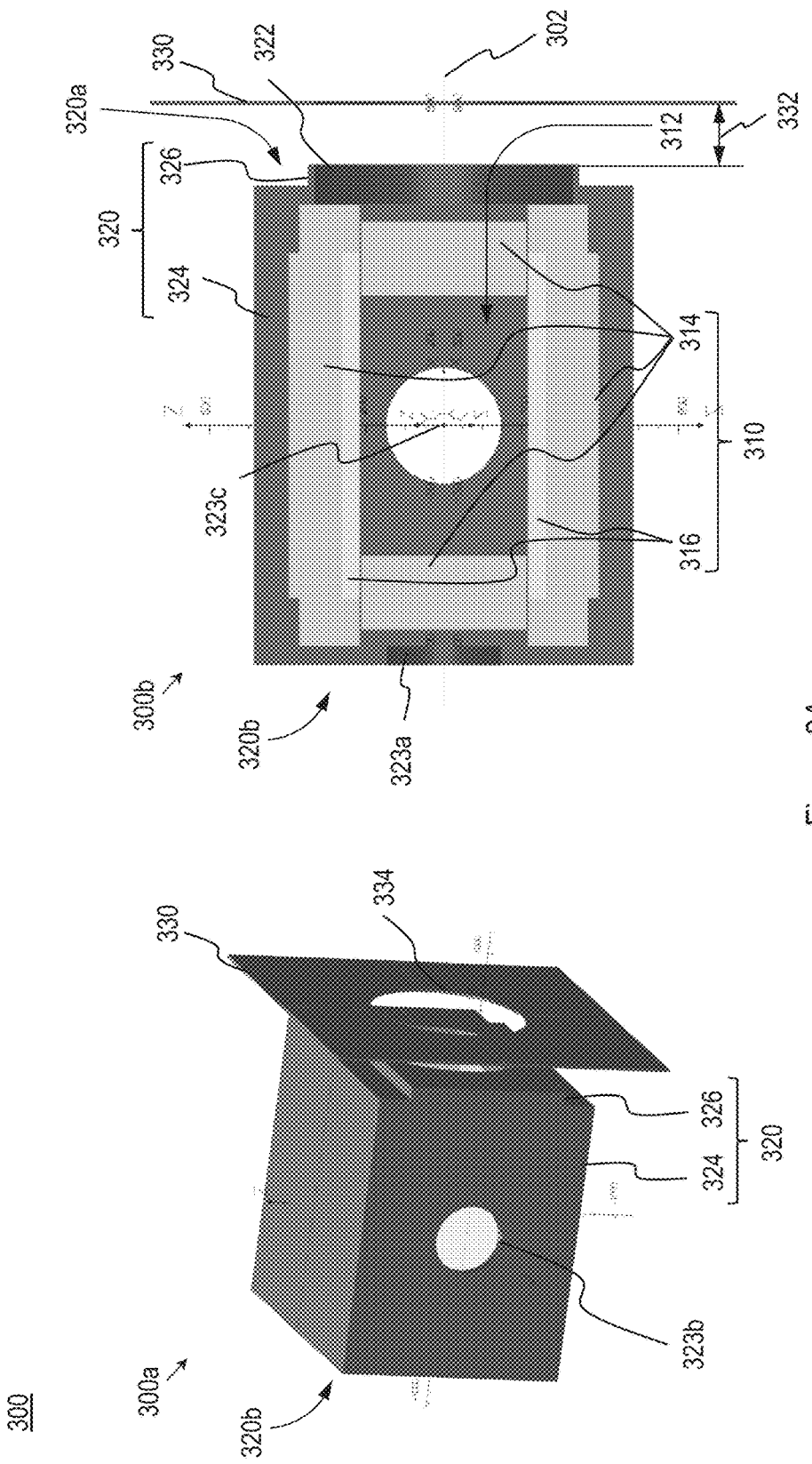
FIGS. 3A-3B schematically illustrate a magnetic resonance imaging (MRI) system, including an asymmetric housing and a plate positioned at a predetermined distance from the housing, according to some embodiments of the invention.
Figure 3B:
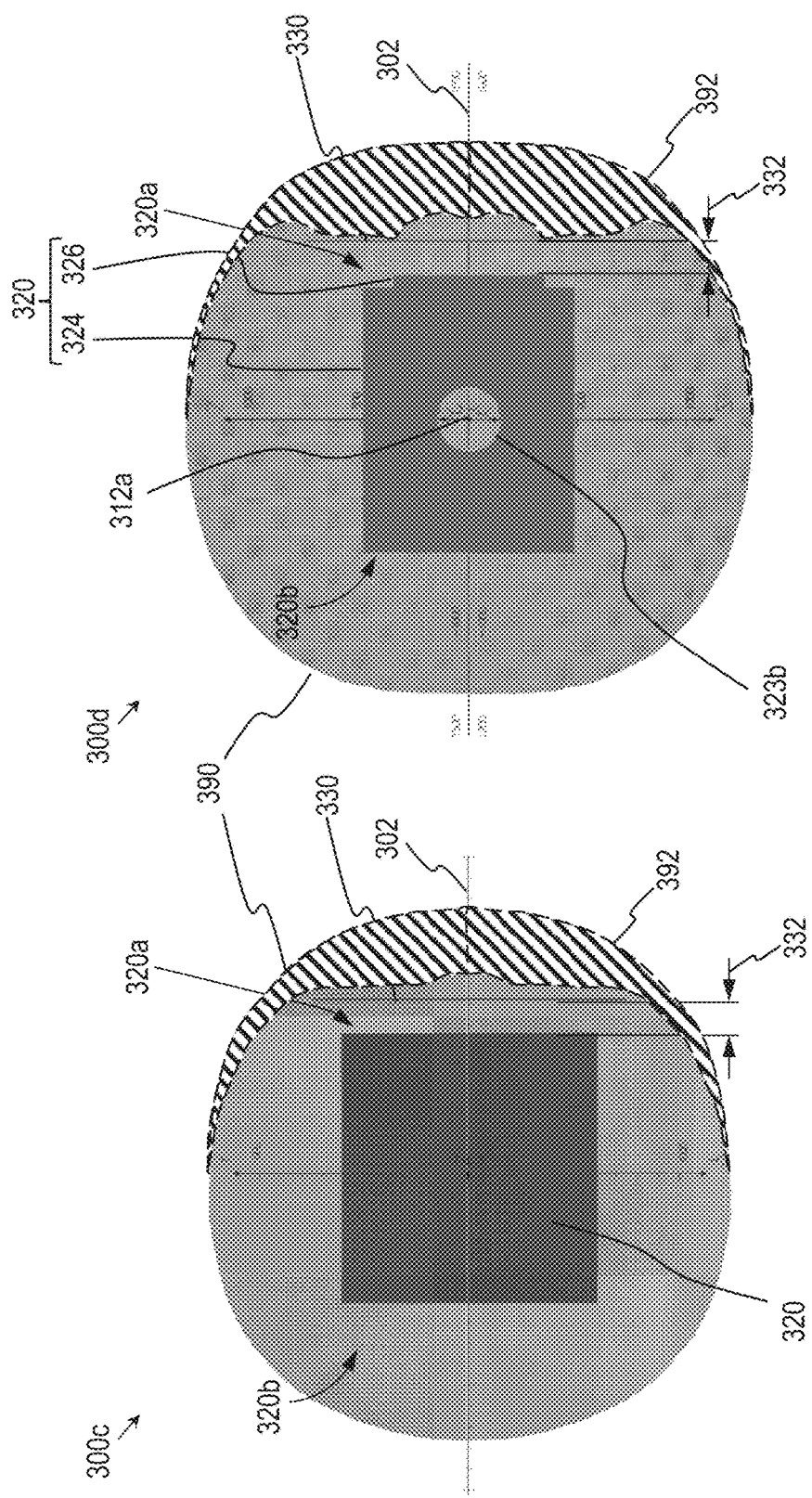

Reference is now made to FIGS. 3A-3B, which schematically illustrate a magnetic resonance imaging (MRI) system 300, including an asymmetric housing 320 and a plate 330 positioned at a predetermined distance from the housing 320, according to some embodiments of the invention.

Illustrations 300a and 300b in FIG. 3A show a perspective view and a side cross-sectional view of the MRI system, respectively. Illustrations 300c and 300d in FIG. 3B show a top view and a side view of the MRI system 300, respectively, and a region 390 surrounding the MRI system 300, in which the magnetic fringe field is greater than a predetermined value.

The MRI system 300 can include a magnetic field device 310. The magnetic field device 310 can generate a magnetic field within a measurement volume 312 and can generate a magnetic fringe field external to the measurement volume 312. In various embodiments, the magnetic field device 310 and/or the measurement volume 312 are identical to the magnetic field device 110 and the measurement volume 112, respectively, as described above with respect to FIGS. 1A-1B, and/or identical to the magnetic field device 210 and the measurement volume 212, respectively, as described above with respect to FIGS. 2A-2B.

The magnetic field device 310 can include multiple magnets 314 (e.g., permanent magnets) and/or multiple ferromagnetic elements 316 (e.g., pole pieces) that can be positioned adjacent to at least one of the multiple magnets 314 (e.g., as shown in FIG. 3A). In various embodiments, magnets 314 and/or ferromagnetic elements 316 are identical to magnets 114 and ferromagnetic elements 116, respectively, as described above with respect to FIGS. 1A-1B, and/or identical to magnets 214 and ferromagnetic elements 216, respectively, as described above with respect to FIGS. 2A-2B.

The MRI system 300 can include a housing 320 that can be made of a ferromagnetic material. The housing 320 can include a proximal end 320a and a distal end 320b along a longitudinal axis 302 of the MRI system 300. The housing 320 can envelope the magnetic field device 310. The housing 320 can include a housing opening 322 at the proximal end 320a. The housing opening 322 can enable insertion of at least a portion of a patient (e.g., a head) within the measurement volume 312 of the magnetic field device 310. In some embodiments, the housing opening 322 is identical to the housing opening 122, as described above with respect to FIGS. 1A-1B, and/or identical to the housing opening 222, as described above with respect to FIGS. 2A-2B. In various embodiments, the housing 320 includes additional openings 323 (e.g., a first additional opening 323a, a second additional opening 323b and/or a third additional opening 323c) that can be identical to the additional openings 123 (e.g., the first additional opening 123a, the second additional opening 123b and/or the third additional opening 123c), as described above with respect to FIGS. 1A-1B, and/or identical to the additional openings 223 (e.g., the first additional opening 223a, the second additional opening 223b and/or the third additional opening 223c), as described above with respect to FIGS. 2A-2B. In some embodiments, the housing 320 includes the housing opening 322 without additional openings 323.

The housing 320 can include a first portion 324 and/or a second portion 326, where a thickness of the first portion 324 can be different from a thickness of the second portion 326 (e.g., as shown in FIG. 3A). In some embodiments, the second portion 326 includes at least a portion of the proximal end 320a of the housing 320. In some embodiments, the thickness of the second portion 326 is greater than the thickness of the first portion 324 (e.g., as shown in FIG. 3A). In various embodiments, the housing 320, the first portion 324 and/or the second portion 326 are identical to the housing 220, the first portion 224 and the second portion 226, respectively, as described above with respect to FIGS. 2A-2B. For example, the thickness of the first portion 324 can range between 45-55 mm and/or the thickness of the second portion 326 can range between 90-110 mm.

The MRI system 300 can include a plate 330. The plate 330 can be positioned external to the housing 320 at a predetermined distance 332 from the proximal end 320a of the housing. The plate 330 can include a plate opening 334. The plate opening 334 can be aligned with the housing opening 322 to allow insertion of the at least portion of the patient (e.g., the head) therethrough into the measurement volume 312. The plate 330 can be made of a metal alloy that can include at least one of: copper, iron, aluminum, ferromagnetic material, paramagnetic material or any combination thereof.

The plate 330 can be coupled to the housing 320 of the MRI system 300 using, for example, a non-ferromagnetic and/or a non-paramagnetic material (e.g., aluminum). In various embodiments, the MRI system 300 is positioned within a desired room and/or the plate 330 is coupled to at least one of: a floor of the room, a ceiling of the room or any combination thereof (not shown).

In various embodiments, the thickness of the second portion 326 of the housing 320, dimensions of the plate 330 and/or the distance 332 between the plate 330 and the proximal end 320a of the housing 320 are predetermined based on a desired weight of the plate and/or based on a desired magnetic fringe field at the plate opening 334. For example, the distance 332 can range between 140-160 mm and/or the plate 330 can have a substantially rectangular shape having a height ranging between 1400-1500 mm, a width ranging between 1400-1500 mm and/or a thickness ranging between 10-14 mm. In various embodiments, a shape of the plate 330 is selected from the group consisting of: a square, a rectangular, and/or an oval.

The MRI system 300 can generate magnetic field within the measurement volume 312 of the magnetic field device 310. The magnetic field measured at a center 312a of the measurement volume 312 can range, for example, between 4900-5100 Gauss. The MRI system 300 can generate magnetic fringe field in a region 390 surrounding the MRI system 300. The region 390 can indicate a region in which the magnetic fringe field is above a predetermined value, for example 10 Gauss. The magnetic fringe field generated by the MRI system 300 can be asymmetric with respect to a center 312a of the measurement volume 312. For example, the region 390 can include a zone 392 (e.g., indicated by a dashed pattern in FIG. 3B) positioned adjacent to the plate 330, in which the magnetic fringe field can be smaller as compared to the magnetic fringe field in corresponding opposite zone of the region 390 poisoned adjacent to the distal end 320b of the housing 320. The magnetic fringe field measured on the longitudinal axis 302 at a predetermined distance of 1000 mm from the center 312a of the measurement volume 312 and adjacent to the plate 330 can range, for example, between 5-7 Gauss, while the magnetic fringe field at corresponding opposite point adjacent to the distal end 320b of the housing 320 can range, for example, between 15-25 Gauss.

Reference is now made back to FIGS. 1-3. In various embodiments, MRI system that includes a housing having varying thickness (e.g., the housing 220 of the MRI system 200, as described above with respect to FIGS. 2A-2B) generates magnetic fringe field that can be lower by ~50% and/or reduces a region that exhibits the magnetic fringe field adjacent to a thicker portion of the housing (e.g., the zone 292 in the region 290, as described above with respect to FIG. 2B) as compared to MRI system that includes housing having uniform thickness (e.g., the housing 120 of the MRI system 100, as described above with respect to FIGS. 1A-1B).

In various embodiments, MRI system that includes a housing having varying thickness and a plate positioned adjacent to a thicker portion of the housing (e.g., the housing 320 and the plate 330 of the MRI system 300, as described above with respect to FIGS. 3A-3B) reduces a region that exhibits the magnetic fringe field adjacent to the plate (e.g., the zone 392 in the region 390, as described above with respect to FIG. 3B) and/or reduces the magnetic fringe field at a plate opening by ~70% and ~85% as compared to MRI system that includes housing having varying thickness only without a plate (e.g., the MRI system 200, as described above with respect to FIGS. 2A-2B) and as compared to MRI system that includes housing having uniform thickness (e.g., the housing 120 of the MRI system 100, as described above with respect to FIGS. 1A-1B), respectively.

In some embodiments, MRI system that includes a housing having varying thickness and a plate positioned adjacent to a thicker portion of the housing reduces the magnetic fringe field in a region adjacent to a plate opening by ~70% as compared to corresponding opposite region adjacent to a distal end of the housing (e.g., the housing 320 and the plate 330 of the MRI system 300, as described above with respect to FIGS. 3A-3B).

In some embodiments, the present invention can include substantially reducing a magnetic fringe field at a housing opening of an MRI system, while eliminating a need for a dedicated MRI room, such that, for example, medical equipment can be positioned adjacent to the housing opening without a risk of being attracted by the magnetic fringe field and/or providing a medical staff with a safe access to a patient undergoing a MRI scan.

In the above description, an embodiment is an example or implementation of the invention. The various appearances of "one embodiment", "an embodiment", "certain embodiments" or "some embodiments" do not necessarily all refer to the same embodiments. Although various features of the invention may be described in the context of a single embodiment, the features may also be provided separately or in any suitable combination. Conversely, although the invention may be described herein in the context of separate embodiments for clarity, the invention may also be implemented in a single embodiment. Certain embodiments of the invention may include features from different embodiments disclosed above, and certain embodiments may incorporate elements from other embodiments disclosed above. The disclosure of elements of the invention in the context of a specific embodiment is not to be taken as limiting their use in the specific embodiment alone. Furthermore, it is to be understood that the invention can be carried out or practiced in various ways and that the invention can be implemented in certain embodiments other than the ones outlined in the description above.

The invention is not limited to those diagrams or to the corresponding descriptions. For example, flow need not move through each illustrated box or state, or in exactly the same order as illustrated and described. Meanings of technical and scientific terms used herein are to be commonly understood as by one of ordinary skill in the art to which the invention belongs, unless otherwise defined. While the invention has been described with respect to a limited number of embodiments, these should not be construed as limitations on the scope of the invention, but rather as exemplifications of some of the preferred embodiments. Other possible variations, modifications, and applications are also within the scope of the invention. Accordingly, the scope of the invention should not be limited by what has thus far been described, but by the appended claims and their legal equivalents.

The invention claimed is:

1. A magnetic resonance imaging (MRI) system, the system comprising:
   a magnetic field device to generate a magnetic field within
      a measurement volume and to generate a magnetic fringe field external to the measurement volume, wherein the measurement volume is to accommodate at least a portion of a patient;

a ferromagnetic housing to envelop the magnetic field device, the housing having a first portion and a second portion, wherein thickness of the first portion is different from thickness of the second portion; and a plate, having a plate opening, positioned external to the housing at a predetermined distance from the housing, wherein the plate opening is aligned with a corresponding housing opening in the housing to allow insertion of at least a portion of the patient therethrough;

wherein the generated magnetic fringe field is asymmetric, and wherein a shape of the plate is selected from the group consisting of: a square, a rectangular, and an oval.

2. The MRI system of claim 1, wherein at least one of the thickness of the second portion of the housing, the distance between the plate and the housing and dimensions of the plate are predetermined to reduce the magnetic fringe field at the plate opening to a predetermined value.

3. The MRI system of claim 1, wherein the second portion of the housing comprises the housing opening.

4. The MRI system of claim 1, wherein the thickness of the first portion of the housing is greater compared to the thickness of the second portion of the housing.

5. The MRI system of claim 1, wherein the plate comprises a metal alloy, the metal alloy comprises at least one of: copper, iron, aluminum, ferromagnetic material, paramagnetic material or any combination thereof.

6. The MRI system of claim 1, wherein the plate is coupled to the ferromagnetic housing using a non-ferromagnetic and a non-paramagnetic material.

7. The MRI system of claim 1, wherein the plate has a thickness of 12 millimeters.

8. The MRI system of claim 1, wherein the predetermined distance is 150 millimeters.

9. The MRI system of claim 1, wherein dimensions of the plate and the distance of the plate from the housing are predetermined based on a desired weight of the plate.

10. The MRI system of claim 1, wherein dimensions of the plate and the distance of the plate from the housing are predetermined based on a desired magnetic fringe field at the plate opening.

11. A magnetic resonance imaging (MRI) system, the system comprising:

a magnetic field device to generate a magnetic field within a measurement volume and to generate a magnetic fringe field external to the measurement volume, wherein the measurement volume is to accommodate at least a portion of a patient;

a ferromagnetic housing to envelop the magnetic field device, the housing having a first portion and a second portion, wherein thickness of the first portion is different from thickness of the second portion; and a plate, having a plate opening, positioned external to the housing at a predetermined distance from the housing, wherein the plate opening is aligned with a corresponding housing opening in the housing to allow insertion of at least a portion of the patient therethrough; wherein the generated magnetic fringe field is asymmetric and wherein the system is positioned within a desired room and wherein the plate is coupled to at least one of: a floor of the room, a ceiling of the room or any combination thereof.

12. The MRI system of claim 11, wherein at least one of the thickness of the second portion of the housing, the distance between the plate and the housing and dimensions of the plate are predetermined to reduce the magnetic fringe field at the plate opening to a predetermined value.

13. The MRI system of claim 11, wherein the second portion of the housing comprises the housing opening.

14. The MRI system of claim 11, wherein the thickness of the first portion of the housing is greater compared to the thickness of the second portion of the housing.

15. The MRI system of claim 11, wherein the plate comprises a metal alloy, the metal alloy comprises at least one of: copper, iron, aluminum, ferromagnetic material, paramagnetic material or any combination thereof.

16. The MRI system of claim 11, wherein the plate is coupled to the ferromagnetic housing using a non-ferromagnetic and a non-paramagnetic material.

17. The MRI system of claim 11, wherein dimensions of the plate and the distance of the plate from the housing are predetermined based on a desired weight of the plate.

18. The MRI system of claim 11, wherein dimensions of the plate and the distance of the plate from the housing are predetermined based on a desired magnetic fringe field at the plate opening.

* * * * *